United States Patent [19]

Weiss et al.

[11] Patent Number: 4,520,307
[45] Date of Patent: May 28, 1985

[54] HIGH-VOLTAGE TIRE TESTING APPARATUS

[75] Inventors: Arnold A. Weiss, 1225 LaSalle, #1008, Minneapolis, Minn. 55403; Dale A. Gustafson, Minneapolis, Minn.

[73] Assignee: Arnold A. Weiss, Minneapolis, Minn.

[21] Appl. No.: 587,670

[22] Filed: Mar. 8, 1984

Related U.S. Application Data

[63] Continuation of Ser. No. 368,357, Apr. 14, 1982, abandoned.

[51] Int. Cl.³ ............................................. G01R 31/12
[52] U.S. Cl. ...................................................... 324/54
[58] Field of Search ...................... 324/54; 73/146, 618

[56] References Cited

U.S. PATENT DOCUMENTS

| | | | |
|---|---|---|---|
| 1,779,907 | 10/1930 | Dye | 324/54 |
| 2,503,992 | 4/1950 | Becker | 324/54 X |
| 2,941,144 | 6/1960 | Cannon | 324/54 |
| 4,297,876 | 11/1981 | Weiss | 73/146 |
| 4,327,579 | 5/1982 | Weiss | 73/146 |

Primary Examiner—Stanley T. Krawczewicz
Attorney, Agent, or Firm—Orrin M. Haugen; Thomas J. Nikolai; Douglas L. Tschida

[57] ABSTRACT

A high-voltage, non-destructive inspection system for detecting nails, and/or cuts and holes in vehicle tires. The system employs a high-voltage head mounted within the tire and a reference head outside the tire opposite to the high-voltage head. The high-voltage head and reference head span the tire tread axially. The inspection is performed in one revolution of the tire.

High-voltage pulses are impressed upon the high-voltage head, and the amplitude and pulse widths are variably selected, commensurate with the type of tire being tested. When a cut, hole or a nail in the tire passes between the high-voltage head and the reference head, an electric arc forms and current passes through the tire. This arc can be visually observed and also electronically detected. Upon detection, via an electronic detection circuit, a lamp lights and the tire rotation is stopped, thus facilitating location of the flaw, via a manual mode.

23 Claims, 13 Drawing Figures

HIGH-VOLTAGE TIRE TESTING APPARATUS

This is a continuation of application Ser. No. 368,357, filed in Apr. 14, 1982, now abandoned.

BACKGROUND OF THE INVENTION

I. Field of the Invention

This invention relates generally to apparatus for detecting flaws in tires and, more specifically, to a high-voltage tire testing system for detecting the presence of nails and/or cuts and holes in tires for wheeled vehicles.

II. Discussion of the Prior Art

In the tire retread industry, visual testing is performed on used tire carcasses to ensure that they are free from cuts, holes and nails. In this regard, it is essential that the testing be accomplished in a minimum of time, yet with reliability so as to ensure that all defective carcasses are culled. The cuts and holes of culled carcasses can then be patched and the nails removed, prior to buffing and retreading.

While visual inspection is reasonably accurate, flaws frequently are missed, due either to human error or to the lack of visible evidence. Missed flaws, during retreading, can create problems in that they allow high pressure air to force its way through the flaws and into the tire structure, causing separation, heat and degradation of the tire, and which in turn can cause a failure of the tire either in the retread shop ("mold blows") or failure of the tire on the road.

At the present time machines do exist for finding holes in tires in retread shops and elsewhere. These machines, however, generally involve tire inflation followed by observation of escaping air either ultrasonically, with bubbles, etc. It is therefore an object of the present invention to permit such testing without inflating the tire and in a fashion that lends itself to the operations of a retread shop. In this regard, the advantages of the present high-voltage method and apparatus to find holes in tires and as hereinafter described in detail are:

1. Detection of extremely small holes down to pinhole size;
2. Detection of holes, cuts or cracks in the inner liner, which penetrate from the inside of the tire into the cord or tread rubber, but do not pass through the tire; such flaws being as important to locate and patch as those that go through.
3. Detection of holes in tires that were retreaded with holes in them and which holes are on the inside and not through the tire.
4. Detection of offset holes where the hole path from the inside to the outside is not-in-line, but rather is connected by a channel through the cord. In such cases, the escaping air is observed in the conventional inflation method on the outside of the tire, while the inside hole location (i.e., the location to be patched) is found by the present invention.
5. Detection of nails, screws, etc. that remain in the tire and which can be removed after test and the hole patched.
6. Detection in certain instances of internal separations in the tire.
7. Simple, fast and easy to use apparatus, that does not require tire inflation, and thereby permits simultaneous visual inspection while performing a high-voltage inspection.

Up to the present, there is no known commercial machine for use in retread shops using high-voltage methods to detect and locate nails, cuts, holes and other flaws in tires. While high-voltage methods for finding holes and flaws in insulating materials are known and have been used in the past, they have never been applied to tires. The application of these methods and new and novel apparatus for finding flaws in tires is therefore the subject of the present invention.

SUMMARY OF THE INVENTION

In accordance with the present invention, the use of high-voltage methods for detecting holes in insulators are uniquely applied to finding flaws such as cuts, holes or nails in tires of various types. The novelty of the present apparatus, includes the use of a high-voltage, high-electric field head placed within a rotating tire and which effectively tests the entire tire tread surface. A grounded or reference head, placed outside the tire opposite to the high-voltage head, completes the electric circuit. Hence, as the tire is rotated, the inside of the tire carcass is swept out and the entire carcass is tested in one revolution.

Pursuant to the present invention and upon applying these methods to finding holes or flaws in tires, it is pointed out that it is important to:

(1) apply the high-voltage, high electric field to the inside of the tire, since the outside tread material is conductive enough to prevent detection. A positive voltage/field is also preferred in that it facilitates arc-over.

(2) select the voltage amplitude, field strength and frequency appropriate to the particular tire type under test, e.g. as follows:

| Tire Type | Fabric | Steel |
| --- | --- | --- |
| Passenger Car | 30 KV, 400 usec | 15 KV, 400 usec |
| Truck | 40 KV, 400 usec | 30 KV, 0.5 usec |

(3) be able to electronically detect the presence of arc-overs, and thereby facilitate the location of the flaw, by detecting manifestations of the arc such as:
 a. electromagnetic fields caused by the arc;
 b. the change in waveform of the applied voltage pulse;
 c. the sound (sonic or ultrasonic) caused by the arc; and
 d. infra-red, visual or ultraviolet emanations due to the arc.

(4) use a high-voltage generator that can generate sufficient current flow during arc-over.

Thus, the methods and apparatus of the present invention can be applied to either truck or passenger car tires, either radial or bias ply, and can be used on tires that have full tread, that have been buffed, or that have been already retreaded, thereby permitting the application thereof to various areas in the retread shop or, for that matter, any shop concerned with flawed tires.

DESCRIPTION OF THE PREFERRED EMBODIMENT

Figure 1:
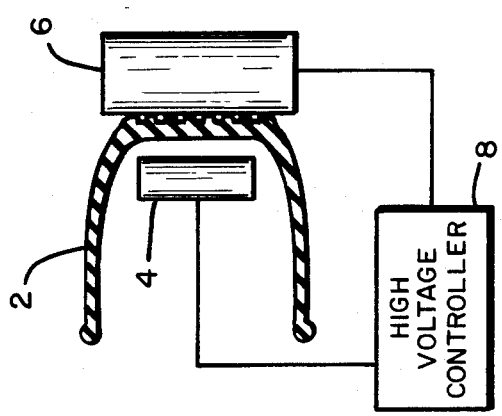
FIG. 1 shows a conceptual block diagram of the present flaw detection apparatus.

Referring to FIG. 1, a generalized block diagram is shown of the various elements which comprise the present invention and which enable the detection of flaws via high-voltage pulses and arc-overs that occur upon moving flaws in the tire carcass 2 into the electric field of the high-voltage head 4 with respect to the reference head 6. Such high-voltage pulses are produced and such arc over conditions are detected by the high-voltage controller 8. Thus, the controller 8 essentially comprises circuitry for controlling the movement of the carcass 2 relative to the heads 4 and 6 and that is operative to produce high-voltage pulses of appropriate pulse widths (i.e. 400 or 0.5 microseconds) and amplitudes such as 15 kv, 30 kv or 40 kv for the referenced pulse widths. The composition and operation of the controller 8 will, however, be described in greater detail hereinafter with respect to FIGS. 5, 6a, 6b and 7.

The high-voltage head 4 is most typically placed internal to the tire carcass 2, as shown, so as to better enable arc-overs, upon the presence of flaws in proximity to the heads 4 and 6. Such a head placement has been determined to be the preferred placement, rather than the alternative placement of the high-voltage head 4 external to the tire while the reference head 6 is inside the tire. In particular, the illustrated head placement is preferred in that the high carbon black content of the tire tread adversely affects the high electric field on the high voltage head 4, when placed external to the tread, and dissipates its strength, thus minimizing the likelihood of arc overs, unless significantly large flaws occur. Also, it has been found that the illustrated placement permits detection of substantially all flaws, while the other arrangement does not, and the most commonly encountered of which are punctures through or internal to the carcass 2 and separations. Thus, while it is preferred that the high voltage head 4 be placed internal to the tire, such is not to the exclusion of the alternative arrangement above referenced. It is also to be noted that the reference head 6, may or may not be placed at ground potential, but for the preferred embodiment it is at ground.

Additionally, it is to be noted that the high voltage head 4 should be placed close to the portion of the tire carcass 2 that is being inspected. Therefore, the head can contact the interior of the tire carcass 2 or be spaced slightly away therefrom, as desired or as appropriate to the specific high-voltage field that is generated by the high-voltage head 4. In the preferred embodiment the high voltage head 4 is spaced approximately = inch from the inside of the carcass, while the reference head 6, which most typically comprises an electrically conductive roller, actually contacts the tread surface.

Figure 2B:
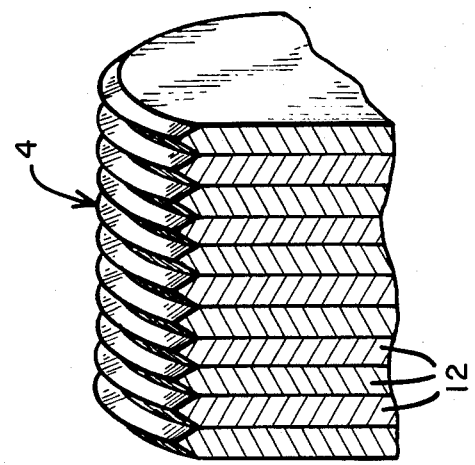
FIG. 2b shows partial perspective view of a high voltage head comprised of a plurality of discs having wedge shaped outer circumferences so as to exhibit high electric fields at the tips thereof.
Figure 2A:
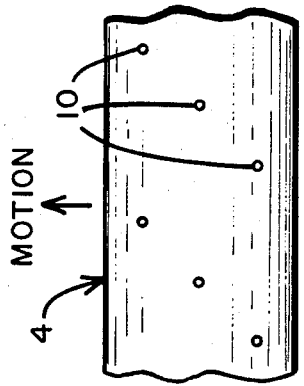
FIG. 2a shows a view of a pin type, high-voltage head, wherein the pins are staggered from one another an appropriate distance to form a high field matrix with respect to the moving tire.

Referring next to FIG. 2a and recalling the desirability of having a high-electric field, it is also to be noted that various alternative head arrangements conducive to high electric fields can be incorporated into the design of the high-voltage head 5. In particular from FIG. 2a, a pin type configuration is shown, wherein a plurality of pins 10 are spaced apart and staggered from one another so as to form a pin matrix of an appropriate length and width. Most typically for the present high-voltage head 4, the pins are spaced approximately ¼ inch from one another, on the diagonal, and which at the hereinafter described pulse widths produces a sufficient electric field so as to detect any flaws present in the tire carcass 2. It is also to be noted that for such a pin type, high-voltage head 4, the head is typically fabricated from a non-conductive material, while all the pins 10 are electrically connected to the same high voltage source, thereby inducing the same electric field at each pin 10 so as to detect any flaws that pass not only directly beneath the pins 10 but also in the area between the pins 10.

An alternative embodiment of the high voltage head 4 can be seen upon reference to FIG. 2b. For this embodiment of the high-voltage head 4, a plurality of washers having wedge like outer circumferences are stacked adjacent to one another so as to produce a corrugated-like outer surface and at the points of which high-voltage fields are generated. Such washers can be fabricated from any electrically conductive material. As before, the primary objective is to produce an appropriate electric field, relative to the reference head 6, so as to create arc-overs upon flaws passing adjacent thereto.

While a roller reference head 6 is a definite requirement for fabric tires, such a head is preferred but not necessarily required for steel tires. The steel in the tire can act as the reference in conjunction with alternative means of bleeding off the charge. However, the preferred embodiment permits testing of fabric and steel tires in one machine so that the roller head is always used.

Figure 3A:
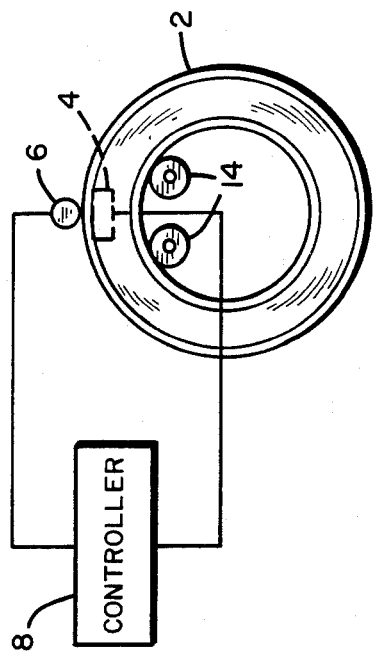
FIG. 3a shows a generalized block diagram of a mechanical arrangement whereby the tire carcass is driven along its beads via drive rollers mounted in conjunction therewith.
Figure 3B:
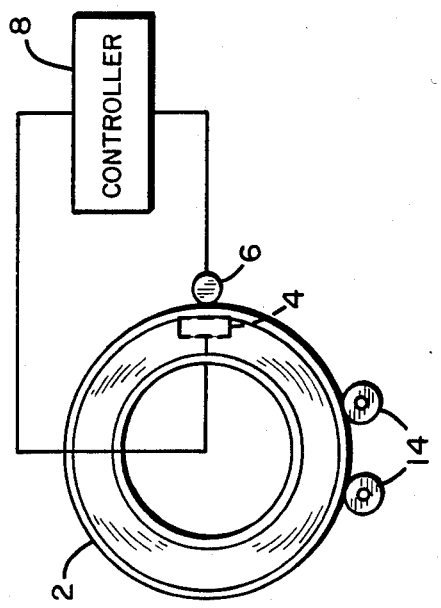
FIG. 3b shows a generalized block diagram of a mechanical arrangement whereby the tire carcass is driven along its tread via drive rollers which act upon the tread of the tire.

In order to ensure that the entire tire carcass is inspected, it becomes necessary to either rotate the tire carcass 2 relative to the heads 4 and 6 or the heads 4 and 6 relative to the carcass 2. The former approach, however, offers the preferred approach, in that it is readily adaptable to known equipment used in retreading shops and elsewhere. Such equipment also offers the ability of either rotating the tire carcass 2 via drive rollers 14 in cooperative relation to the beads of the carcass 2, see FIG. 3a, or of rotating the carcass 2 via drive rollers 14 mounted in cooperative relation with the tread surface of the tire, see FIG. 3b. Either of the drive arrangements of FIGS. 3a and 3b will produce the desired result of rotating the tire with respect to the stationary heads 4 and 6. Depending upon the manner of rotation, the heads 4 and 6 are accordingly adjusted so as to be most advantagously placed with respect to the drive rollers 14. Thus, the arrangements of FIGS. 3a and 3b are merely suggestive of any number of other mechanically possible arrangements that can be adapted to presently available rotating equipment. It is also to be noted that in the arrangement of FIG. 3b, one of the drive rollers can also act as the reference head 6.

Figure 4:
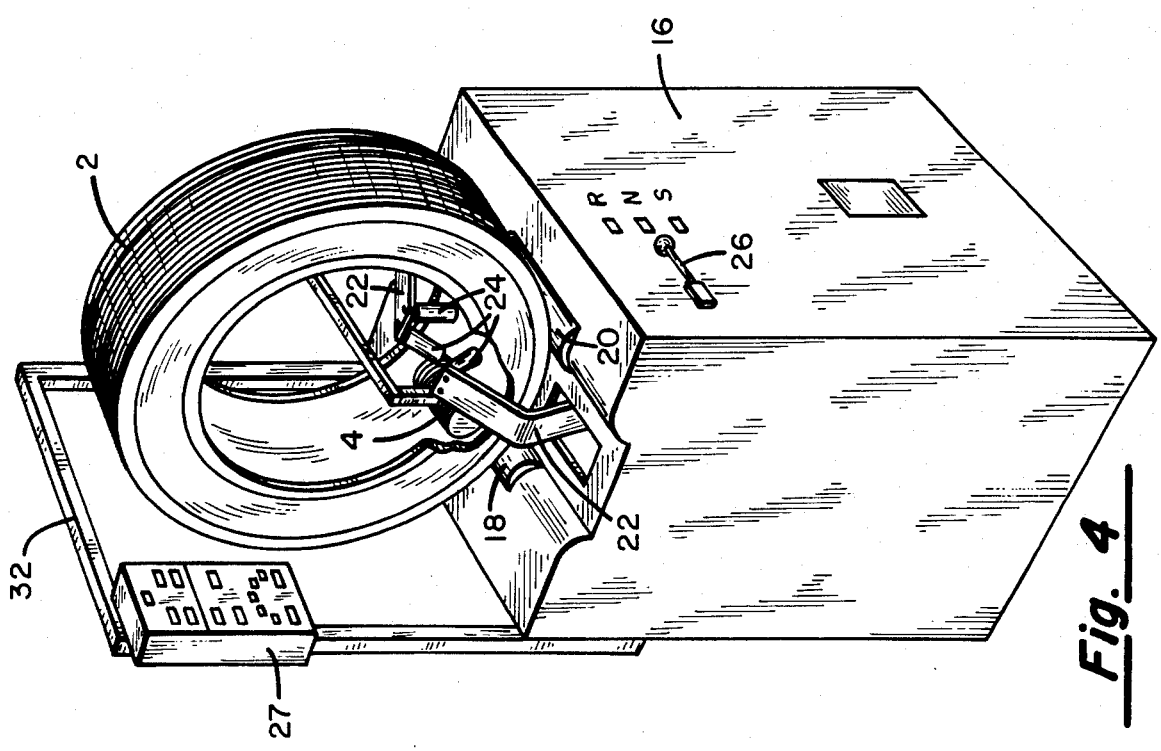
FIG. 4 shows a more detailed perspective view of apparatus employing the concepts of FIG. 3b.

A particular arrangement, of the type shown in FIG. 3b, can be seen upon reference to FIG. 4. In particular, the apparatus of FIG. 4 is essentially the same as disclosed in my previous U.S. Pat. No. 4,274,289, except now the present invention has been incorporated therein in lieu of the earlier disclosed ultra-sonic testing apparatus. Thus, as before, the present invention has been incorporated into a rotating drive mechanism, such as manufactured by the Branick Division of Applied Power Inc. of Fargo, North Dakota. In particular, the apparatus of FIG. 4 comprises a generally rectangular base cabinet 16 which contains motor driven drive rollers 18 and 20 and upon which the tire carcass 2 rests, during inspection. Also contained within the base 16, are a pair of air-operated spreader arms 22 that upon actuation act to spread the beads of the tire apart via roller pairs 24 that are journaled into the ends of the spreader arms 22. Thus, the tire carcass 2 is rotated via the drive rollers 18 and 20 while the beads are spread via the spreaders 22.

The spreader control is achieved via a control lever 26 that is selectively operable in any one of three position (i.e. spread, neutral or release). Similarly the drive motor (not shown) is controlled via appropriate on/off and speed control switching, either manually via panel 27 or automatically via controller electronics (not shown). A drive speed of approximately 5 inches per second can then be adjusted and is sufficient to enable the detection of flaws as they pass through the electric field between the heads 4 and 6. Similarly, the stopping action of the motor should be adjusted so that the carcass 2 does not continue rotating and move too far beyond detected flaws so as to make it difficult for the operator to appropriately locate and mark any detected flaws.

Upon spreading the tire carcass 2, the high voltage head 4 is inserted into the interior of the carcass 2 via a suitable mechanical linkage 25 so that the head 4 is positioned in the desired spacial relationship to the interior surface of the spread carcass 2. The drive rollers in this configuration is grounded and in contact with the tread surface and is used as the reference roller as previously discussed. Thus, the appropiate position for the high-voltage head 4 (i.e., inside the tire and opposite to one of the drive rollers 18 or 20) is achieved. Furthermore, the apparatus of FIG. 4 acts to spread the tire, during test, so as to permit a visual internal and external inspection while the carcass 2 is undergoing high-voltage inspection.

While FIG. 4 demonstrates one example of a high voltage flaw inspection apparatus with respect to FIG. 3b, it is to be recognized that still others may suggest themselves to those of skill of art. Furthermore, the present invention can be adapted to apparatus of the type mentioned with respect to FIG. 3a and for example which type of equipment may be an "Elrick" spinner. In either event, the present invention is readily adaptable to various commercially available, mechanical tire handling apparatus so as to permit high-voltage flaw detection via the generation of arc-overs at the flaws, for any of the above-referenced configurations. Such arc-overs also being visually observable so as to permit the operator to mark the flawed area with an appropriate marker, such as a crayon, for subsequent repair, prior to retreading. Thus, the present apparatus can be employed either before or after buffing in a retreading operation. Additionally, the present apparatus can be employed in tire repair shops for detecting slow leaks, which otherwise were previously detected via water tanks, upon inflating the tire to high pressures. Such techniques, however, consumed a great deal of time and which can now be saved, via the present invention.

Figure 5:
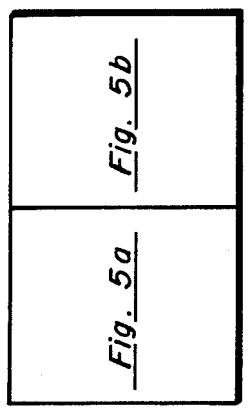
FIG. 5, comprised of FIGS. 5a and 5b, shows a schematic diagram of controller circuitry for applying high-voltage pulses to the tire carcass, for detecting the presence of an arc and for controlling the tire rotating mechanism.
Figure 5A:
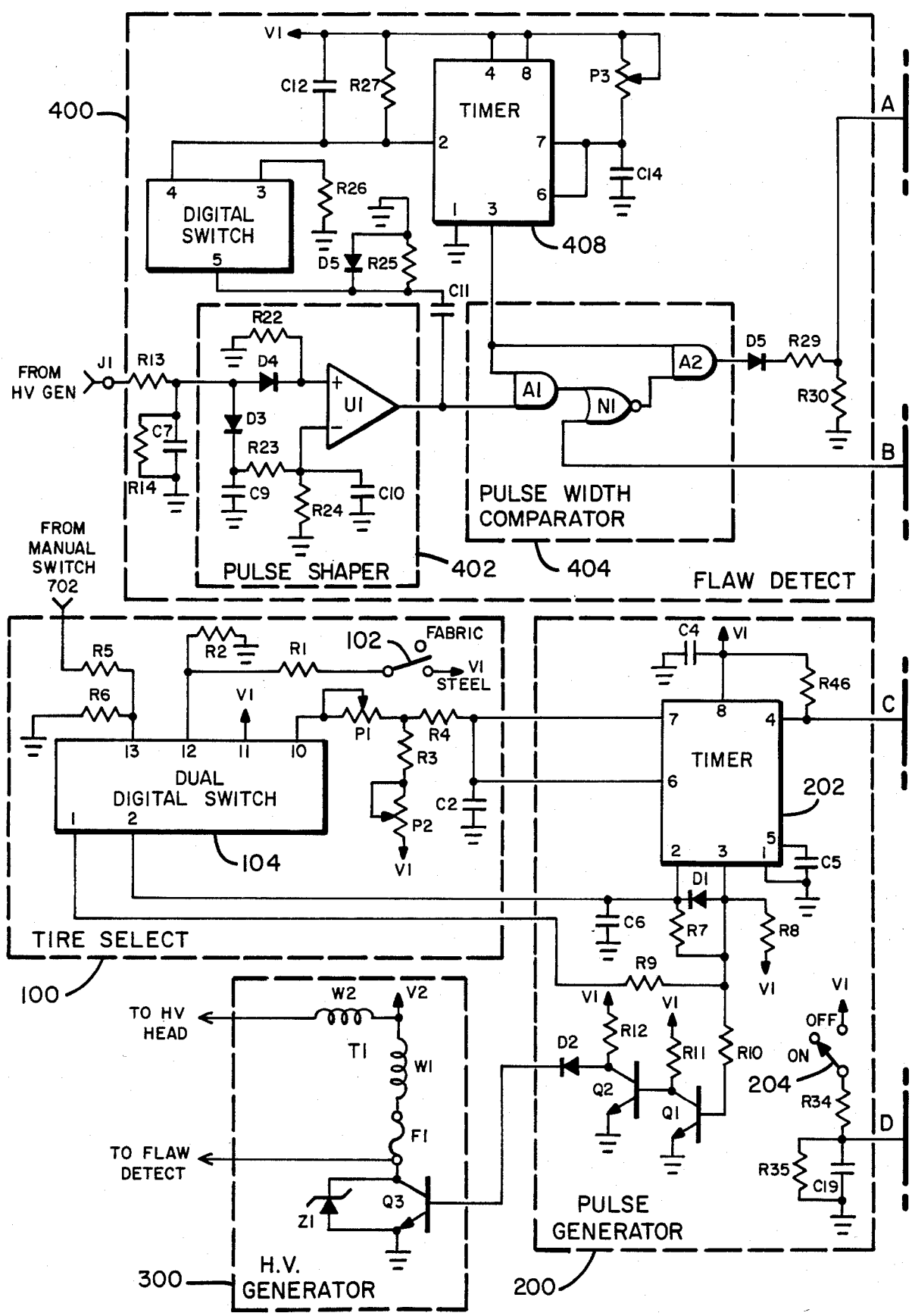
Figure 5B:
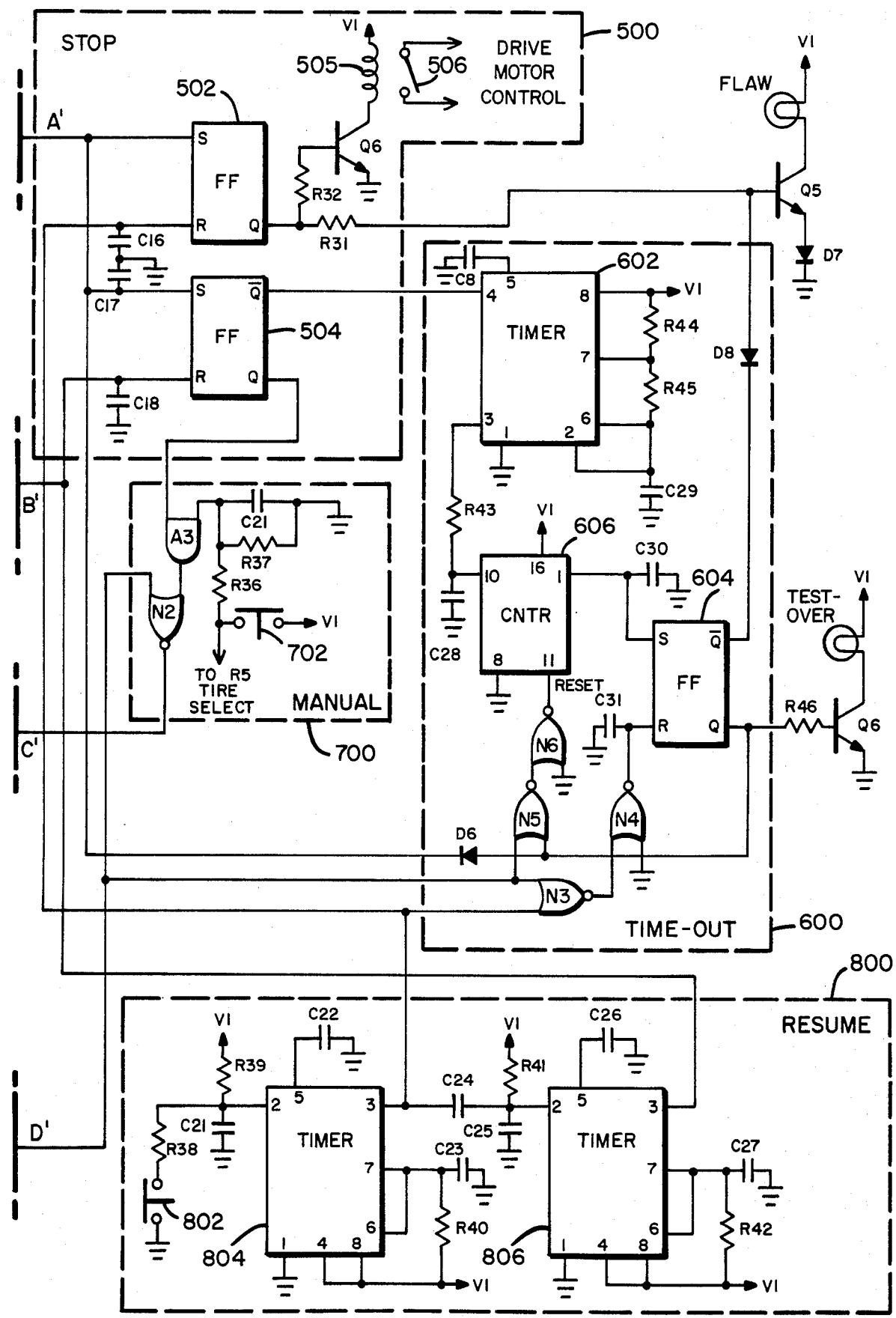

Referring now to FIG. 5, comprised of FIGS. 5a and 5b, a detailed schematic diagram is shown of the circuitry for controlling the above described apparatus. In particular, FIGS. 5a and 5b show the electronic circuitry required to implement a system for passenger car tires including either fabric or steel types. Additionally, fabric truck tires can be tested using the fabric mode of the circuitry of FIGS. 5a and 5b; while substitution of the circuitry of FIGS. 6a and 6b for the corresponding functional equivalents of FIGS. 5a and 5b, permits the testing of steel radial truck tires.

Referring now to the high-voltage generator 300, this circuit produces the appropriate high-voltage pulses that are impressed on the high-voltage head. The transistor Q3 is a switching power transistor which connects/disconnects one side of the primary winding W1 of the transformer T1 to ground. The other side is connected to V2(15 volts). When transistor Q3 is on, current flows through the winding W1 and the magnitude thereof increases approximately linearly with time. At 3 msec, for example, the current reaches 8 amps. Disconnecting transistor Q3 at this time (i.e., 3 msec) quickly shuts off the current supply and causes the transformer to ring with an "inductive kick". The period of the oscillation is thus determined by the electrical characteristics of the transformer T1, the high-voltage head 4 and the tire under test. Typically, though, the period is about 800 usec. On the other hand, the amplitude of the voltage oscillation is proportional to the current at the time of shut off and is, for a current of 8 amps, 300 volts at the primary winding W1 and 30,000 volts at the secondary winding W2. The diode Z1, clamps any negative swing, thus only a positive voltage pulse appears. In this way positive, high-voltage pulses of 400 usec pulse widths are generated. The amplitude of each then depends on the current flowing in transistor Q3 at shut-off and which, in turn, depends on the turn-on time of transistor Q3. The turn-on time, however, is controlled by pulse generator 200.

It should also be noted that whereas, in this embodiment, high-voltage pulses are used, an alternative arrangement involving continuous wave voltages could also be used with equal effectiveness. The pulse schemes are preferred, however, because of the cost factors involved.

As mentioned, it is desired for passenger car tires that the high-voltage generator 300 produce 30 kv pulses for fabric tires and 15 kv pulses for steel. In order to perform in this fashion, the pulse generator 200 must turn on transistor Q3 for either 3 msec (30 kv) or 1.5 msec (15 kv). This on-time is controlled by means of timer 202 in conjunction with the RC time contant presented at terminals 6 and 7 thereof. This time constant is selected using the Tire Select circuitry 100 which, by means of the digital switch 104, creates an RC network of either 3 msec as determined by potentiometer P2, resistors R3 and R4, and capacitor C2 or 1.5 msec as determined by potentiometers P1 and P2, resistors R3 and R4, and capacitor C2. It should also be noted that the on-time of transistor Q3 can be varied via the potentiometers P1 and P2, thus permiting the generation of other high-voltage pulses. For example, 40 kv pulses can be generated for fabric truck tires by changing P2 so as to create a 4 msec on-time.

The off-time of each pulse period and of the timer 202 then determines the pulse rate for the high-voltage pulses. The off-time normally is 5 msec as determined by the time constant of resistors R9 and R7, and capacitor C6. In the manual mode, however, the pulse rate is reduced and the off-time is extended to 25 msec by the action of digital switch 104, switching out resistor R9 through the actuation of the manual button 702 in the manual circuit 700.

Before continuing, it should be noted that the present apparatus generally operates in two modes of operation:

Normal Mode—During Normal mode, the tire is rotated and scanned for flaws. When an arc-over occurs, the Flaw Detection circuitry 400 signals the Stop circuitry 500 to stop tire rotation, shut off the high voltage supply and light the flaw lamp. At that point the operator knows the circumferential position of the flaw and can so mark the carcass 2. In this mode, a tire speed of approximately 5-inches/second and the pulse rate of 6-8 msec/pulse allows sampling of the tire 2 at least once each 0.1-inches, and which is appropriate for proper scanning and location of flaws.

Manual Mode—After a flaw is detected in the Normal mode, it can next be pinpointed via the Normal mode. By pushing the manual button 702 the high-voltage supply is again turned back on, but rotation and flaw detection are inhibited. Thus, continuous arc-overs occur at the flaw and the resultant visual observation of the arcs by the operator will permit precise flaw location. However, the pulse rate is reduced in this mode to prevent overheating of the tire and the electronics which, in this case, are each seeing continuous arcing conditions.

Continuing now, the Stop circuitry 500 contains flip-flops 502 and 504 which store flaw detection and time-out signals. The output of these flip-flops 502 and 504, in turn, control the tire rotation drive motor, the flaw lamp, the operation of the High-Voltage Generator 300 via the Pulse Generator 200 and the Time-Out circuitry 600.

The Resume circuitry 800 is used in the Normal mode after the Stop circuitry 500 halts operation on the occasion of a flaw. This circuitry then permits the resumption of testing after the Manual mode to search for additional flaws. Pressing the resume button 802 resets the stop flip-flops 502 and 504 and holds them off until the system is stabilized.

The Time-Out circuit 600 is used to shut off the normal testing mode after a 30 sec period from test start has elapsed. The timer 602, which is on only during the Normal mode and not during the Manual mode, provides the counter 606 with the timing pulses with which to establish this interval. The counter 606 is reset each time the tire is removed or if the high-voltage switch 204 is turned off.

Figure 7A:
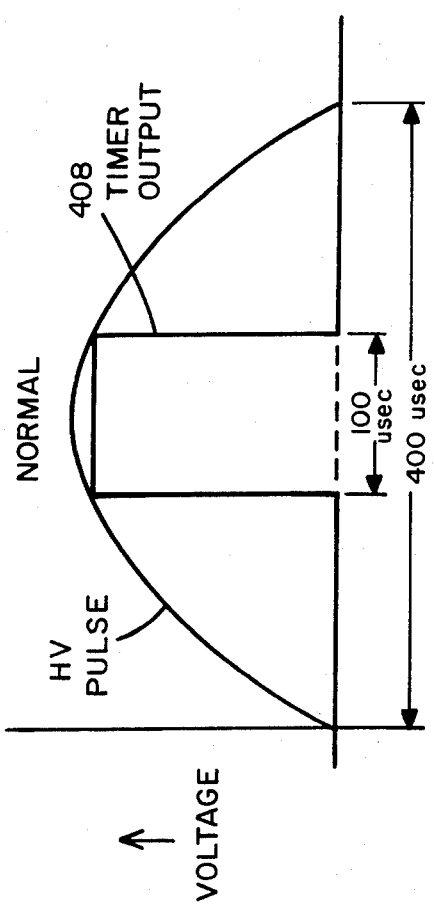
FIG. 7, comprised of waveforms 7a and 7b, shows respective diagrammatical detection waveforms for a normal and a flaw condition.

The operation of the Flaw Detect circuit 400 can best be explained with reference to FIGS. 7a and 7b. FIG. 7a shows a 400 usec high-voltage pulse as it appears in a normal, non-flaw condition. The pulse shaper 402 operates on an attenuated version of this pulse to form a logic level pulse of about ¼ of the width of the high-voltage pulse (i.e., 100 usec). This 100 usec pulse width indicates a normal condition. Another pulse of this width is also generated each pulse time by the timer 408 for use as a reference. Then pulses are then continuously compared by the pulse width comparator circuitry 404.

Figure 7B:
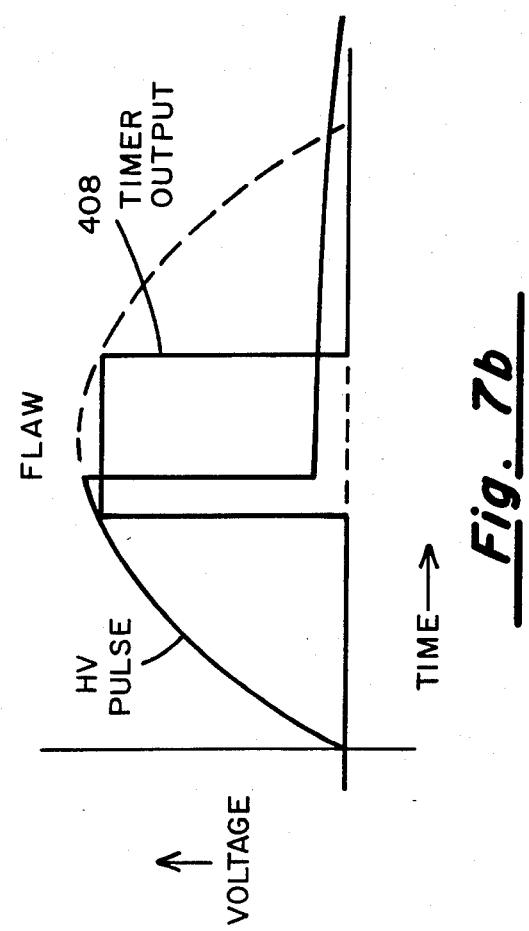

When flaws are located and arc-overs occur, as indicated in FIG. 7b, the high voltage signal collapses. A narrower actual pulse is then generated by the pulse shaper. The pulse width comparator 404 then compares the actual, shorter pulse width from the pulse shaper 402 with the reference pulse width from the timer 408 and produces an output logic signal, thus indicating that the actual pulse width is less than the reference pulse width and the presence of a flaw. The Stop circuitry 500 in response thereto then stops the high-voltage circuitry and the drive motor and lights the flaw lamp.

Figure 6A:
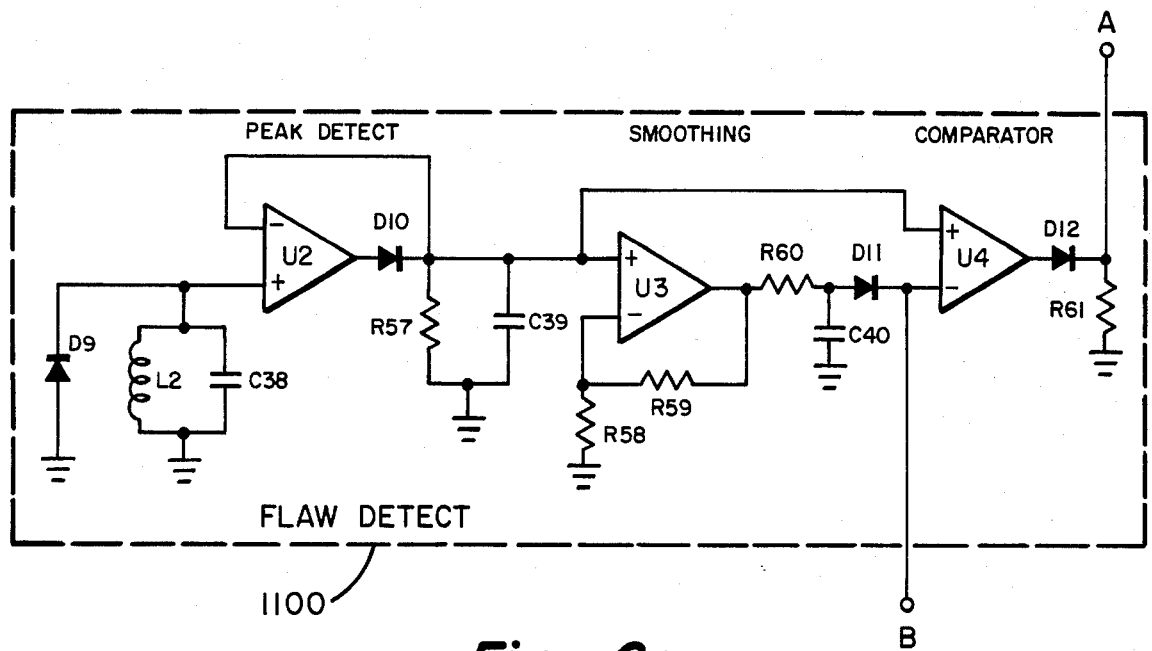
FIG. 6a shows alternative flaw detect circuitry for use with radial truck tires.
Figure 6B:
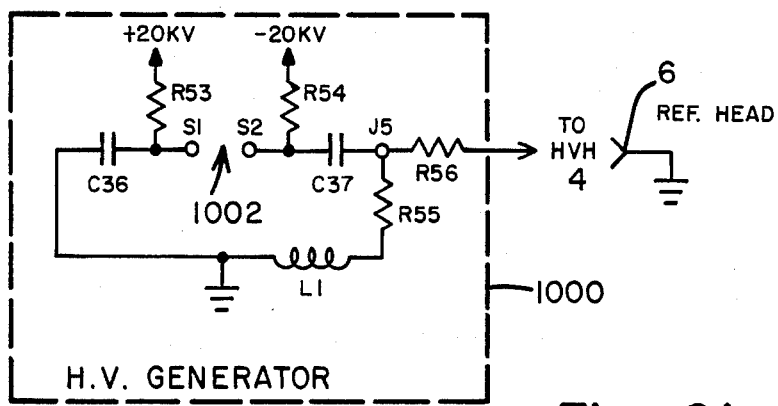
FIG. 6b shows alternative high-voltage generator circuitry for producing higher frequency pulses for radial truck tires.

Referring now to FIGS. 6a and 6b, two circuits are shown, one a high-voltage generator circuit 1000 and the other a flaw detect circuit 1100. These circuits are identical in function to those previously described for the respective High-Voltage Generator circuitry 300 and the Flaw Detect circuitry 400, however, these circuits produce high-voltage pulses at a higher frequency or of a much lower pulse width, namely 0.5 usec. These higher frequency circuits are substituted for their counterparts in FIGS. 5a and 5b when testing radial truck tires. Because radial truck tires are constructed wholly of steel (i.e., steel cord and steel belt), when using the 400 usec pulses on steel tires, the high-voltage amplitude must be reduced to prevent tire breakdown and false arc-over in the unflawed tire, as the insulating layers of the tire are quite thin. Steel radial truck tire construction, thus, requires that the amplitude of the high-voltage pulses to be reduced to 10 kv or less to prevent false arc-over from occurring with the 400 usec pulses. Such levels, however, significantly compromise the detection capabilities of the circuitry. It has been noted, however, that by operating at higher pulse frequencies, advantage can be taken of the increased dielectric strength of the rubber and the lower breakdown voltage of air that pertains thereto. Thus, 1 MHz pulses (i.e. 0.5 msec pulse widths) permit the testing of radial truck tires at pulse amplitudes of 30 kv without causing false arc-overs, and while maintaining accurate flaw detection capabilities.

In this regard, the High Voltage Generator circuitry 1000 of FIG. 6a uses a capacitor discharge circuit for generating the high-voltage pulses. In particular, capacitors C36 and C37 are charged towards ±20 kv through resistors R53 and R54. The voltage potential between the spark heads S1 and S2, across the spark gap 1002, thus increases toward 40 kv as the capacitors C36 and C37 charge. The spark gap distance, however, is adjustable and is typically set to breakdown at 30 kv. When this occurs, capacitors C36 and C37 discharge through the RL network, comprised of resistor R55 and inductor L1, causing a positive 30 kv pulse to appear at the junction J5. This voltage is then coupled to the high voltage head 4 by way of resistor R56. This particular type of circuit is advantageous at the higher frequencies, since the load imposed at these frequencies by a full tire width high-voltage head 4 is such as to load down most transformer-operated circuits of the type in FIG. 5a.

The Flaw Detector circuitry 1100 for the modified truck tire testing circuitry senses arc-overs via magnetic field coupling between coil L2, placed a few feet from the head, and the arc-over circuitry containing the High-Voltage Generator 1000, the heads 4 and 6, and the tire carcass 2. Capacitor C38, in turn, tunes the coil L2 to resonate at the frequency of interest, 1 MHz, while diode D9 protects the operational amplified U2. Under normal operation, a typical 1 MHz, 2 volt signal appears across the coil L2, while during an arc-over, a sudden increase in amplitude occurs to typically 4 volts. The peak detector containing U2, in turn, transforms the detected amplitudes to a corresponding DC level. These DC signals are then smoothed by the smoothing circuitry containing operational amplifier U3. The comparator circuitry containing operational amplifier U4 then compares the smoothed reference amplitude to the instantaneous amplitude. and any sudden increase in the compared signals causes a positive going pulse to appear at resistor R61. This pulse then operates the Stop flip-flops 502 and 504, as previously described, and causes the interruption of high-voltage supply, the lighting of the flaw lamp and the halting of tire rotation.

While the present invention has been described with respect to various embodiments and variations thereof, it is to be recognized that still other embodiments and variations of the circuitry, may be suggested to one of skill in the art upon a reading hereof or upon exposure to the circuitry. It is therefore contemplated that the following claims should be interpreted to include such equivalent structures.

What is claimed is:

1. Non-destructive, flaw detecting apparatus comprising:

first and second flaw detecting heads;
   means for moving a tire under test relative to said first and second heads and/or said first and second heads relative to said tire;
   means coupled to said first and second heads for generating a voltage of a predetermined amplitude, pulse width and pulse repetition rate depending upon the type of the tire under test, and establishing a potential difference therebetween whereby an arc is produced between said first and second heads upon detecting the presence of a flaw in said test tire in the vicinity between said first and second heads; and
   means responsively coupled to arc-overs for stopping the movement of said test tire so as to permit an operator to mark a detected flaw, said stopping means including:
   means for producing pulse width varying control signals relative to said generated voltage at said first and second heads;
   means responsive to arc-overs for comparing a first control signal indicative of the arc-over detected pulse width with a second control signal indicative of a reference pulse width and for producing a flaw detect control signal upon detecting an inequality therebetween.

2. Apparatus as set forth in claim 1 wherein said voltage generating means includes:

a transformer having primary and secondary windings;
   a switching transistor coupled in series with said primary windings; and
   means for controllably switching said transistor on and off at a predetermined frequency and thereby generating a voltage output at said secondary winding of a predetermined frequency and amplitude.

3. Apparatus as set forth in claim 2 wherein said voltage generating means is selectively operable to produce pulses at pulse widths from 1 millisecond to 20 microseconds and at 5 kv to 50 kv.

4. Apparatus as set forth in claim 1 wherein at least one of said first and second flaw detecting heads is comprised of a plurality of pins spaced from one another so as to create high electric fields at the tips thereof.

5. Apparatus as set forth in claim 1 wherein at least one of said first and second flaw detecting heads is comprised of a plurality of electrically conductive discs, each disc having a ridged outer circumference whereby electrical fields are created at the tips of the ridges.

6. Apparatus as set forth in claim 1 including means for manually inducing arc-overs, when said test tire has been stopped at a flaw, thereby facilitating the operator's locating of such flaws.

7. Apparatus as set forth in claim 1 including means for automatically resuming movement of said test tire after detecting a flaw, until the detection of the next flaw or the completion of the movement and inspection of the test tire relative to said first and second heads.

8. Apparatus as set forth in claim 7 including means for automatically stopping said voltage generating means and said test tire moving means, upon the expiration of a predetermined time interval.

9. Apparatus as set forth in claim 1 wherein said voltage generating means includes:

first and second spark heads axially separated by a predetermined spark gap;
   first and second capacitive elements coupled to said respective first and second spark heads;
   means controllably charging and discharging said first and second capacitive elements to a predetermined potential difference whereat a spark occurs across said spark gap for producing a relatively high voltage sufficient to induce arc-overs through flaws in said test tire.

10. Non-destructive, flaw detecting apparatus comprising:

first and second flaw detecting heads;
    means for moving a tire under test relative to said first and second heads and/or said first and second heads relative to said tire;
    means coupled to said first and second heads for generating a voltage of a predetermined amplitude and pulse width and establishing a potential difference therebetween whereby an arc is produced between said first and second heads upon detecting the presence of a flaw in said test tire in the vicinity between said first and second heads; and
    means responsively coupled to arc-overs for stopping the movement of said test tire so as to permit an operator to mark a detected flaw, said stopping means including:
    means magnetically coupled to said first and second heads and operative at the pulse width of the generated voltage for producing a proportional control signal therebetween;
    means for sampling and delaying each sample of said control signal;
    means comparing non-delayed ones of said samples to said delayed samples for producing a flaw detect signal upon detecting a difference therebetween.

11. Apparatus as set forth in claim 10 wherein said voltage generating means includes:
- first and second spark heads axially separated by a predetermined spark gap;
- first and second capactive elements coupled to said respective first and second spark heads;
- means controllably charging and discharging said first and second capacitive elements to a predetermined potential difference whereat a spark occurs across said spark gap for producing a relatively high voltage sufficient to induce arc-overs through flaws in said test tire.

12. Non-destructive, flaw detecting apparatus comprising:
- first and second heads, said first head mounted inside the carcass of a tire under test and said second head mounted opposite said first head over a portion of the exterior of said tire;
- means for moving a tire under test relative to said first and second heads and/or said first and second heads relative to said tire;
- means coupled to said first and second heads for establishing a voltage potential difference of a predetermined amplitude and pulse width therebetween depending upon the type of tire under test, and wherein said first head exhibits a high electric field, whereby an arc is produced between said first and second heads upon the presence of a flaw in said test tire in the vicinity between said first and second heads.

13. Apparatus as set forth in claim 12 including:
- means responsive to arc-overs for stopping the movement of said test tire and/or said first and second heads so as to permit an operator to locate a detected flaw.

14. Apparatus as set forth in claim 13 including means for inducing arc-overs, when said test tire has been stopped at a flaw, thereby facilitating the operator's locating of the detected flaw.

15. Apparatus as set forth in claim 13 including means for resuming the movement of said test tire and/or said first and second heads, until the next flaw is detected or the inspection of the tire under test has been completed.

16. Apparatus as set forth in claim 12 including means for automatically stopping said voltage generating means and said test tire and/or said first and second head moving means upon the expiration of a predetermined time interval.

17. Apparatus as set forth in claim 12 including means coupled to said voltage generating means for selectively varying the amplitude of said generated voltages, depending upon the type of test tire.

18. Apparatus as set forth in claim 12 including means coupled to said voltage generating means for selectively varying the voltage amplitude and pulse width of said generated voltages, depending upon the type of test tire.

19. Apparatus as set forth in claim 12 wherein said voltage generating means produces pulses at said predetermined amplitude and pulse width of a duration in the range of less than one microsecond to one millisecond depending upon the type of tire under test.

20. Apparatus as set forth in claim 19 wherein said voltage generating means produces pulses at an amplitude in the range of 5 kv to 50 kv.

21. Apparatus as set forth in claim 12 including means for sensing an arc-over between said first and second flaw detecting heads via the comparing of a reference control signal to a sample control signal and the determining of a predetermined relation therebetween.

22. Non-destructive, flaw detection apparatus for tires comprising:
- a high voltage, high field head;
- a reference head;
- means for suspending and rotating a tire between said high-voltage head and said reference head, said high-voltage head being mounted within the carcass of said tire and said reference head being mounted external to said tire and opposed to said high-voltage head; and
- means coupled to said high-voltage and reference heads for generating voltages of a predetermined amplitude and pulse width so as to induce arc-overs through said tire when a flaw is in the proximity of said high voltage and said reference heads.

23. Non-destructive, flaw detecting apparatus comprising:
- a first head mounted inside the carcass of a metal containing tire under test;
- means for moving said tire under test relative to said first head and/or said first head relative to said tire;
- means coupled to said first head for establishing a voltage potential and a high electric field thereat whereby an arc is produced between said first head and said metal upon the presence of a flaw in said test tire in the vicinity of said first head.

* * * * *

UNITED STATES PATENT AND TRADEMARK OFFICE
CERTIFICATE OF CORRECTION

PATENT NO. : 4,520,307
DATED : May 28, 1985
INVENTOR(S) : Arnold A. Weiss et al

It is certified that error appears in the above-identified patent and that said Letters Patent are hereby corrected as shown below:

Column 10, Line 16, after "whereby" the word -- high -- should be inserted.

Signed and Sealed this

Twentieth Day of August 1985

[SEAL]

Attest:

DONALD J. QUIGG

Attesting Officer

Acting Commissioner of Patents and Trademarks